(12) United States Patent
Varner et al.

(10) Patent No.: US 6,724,260 B2
(45) Date of Patent: Apr. 20, 2004

(54) LOW POWER CURRENT FEEDBACK AMPLIFIER

(75) Inventors: Alan Lee Varner, Tucson, AZ (US); Ahmad Dashtestani, Tucson, AZ (US); Joel M. Halbert, Tucson, AZ (US); Michael A. Steffes, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/306,212

(22) Filed: Nov. 27, 2002

(65) Prior Publication Data

US 2003/0184386 A1 Oct. 2, 2003

Related U.S. Application Data

(60) Provisional application No. 60/368,372, filed on Mar. 28, 2002.

(51) Int. Cl.[7] ................................................. H03F 3/04
(52) U.S. Cl. .................... 330/288; 330/257; 323/315
(58) Field of Search ............................... 330/288, 293, 330/257; 323/315, 316; 307/451

(56) References Cited

U.S. PATENT DOCUMENTS

| 4,536,662 A | * | 8/1985 | Fujii |
| 4,639,685 A | | 1/1987 | Saller et al. |
| 4,818,901 A | * | 4/1989 | Young et al. |
| 4,897,616 A | * | 1/1990 | Wang et al. |

OTHER PUBLICATIONS

Electronic Design, "*Wideband Op Amp Unshackles Gain From Bandwidth,*" Oct. 29, 2001, www.elecdesign.com.

* cited by examiner

*Primary Examiner*—Henry Choe
(74) *Attorney, Agent, or Firm*—W. Daniel Swayze, Jr.; W. James Brady; Frederick J. Telecky, Jr.

(57) ABSTRACT

A low power current feedback amplifier having a lower output impedance input stage is provided. To reduce the output impedance, an input stage comprises a closed-loop input buffer. An exemplary input buffer comprises a closed-loop current feedback amplifier configured within the overall current feedback amplifier, wherein the output of the input buffer corresponds to the inverting node of the overall current feedback amplifier. The closed-loop configuration of the input buffer is facilitated by the use of an internal feedback resistor coupled from an inverting input terminal of the input buffer to the output of the input buffer, which corresponds to the inverting input terminal of the overall current feedback amplifier. The closed-loop input buffer realizes a low output impedance since the loop gain reduces the output impedance of the input buffer. With a lower output impedance, the bandwidth of the current feedback amplifier becomes more independent of the gain, even at low current implementations.

26 Claims, 7 Drawing Sheets

LOW POWER CURRENT FEEDBACK AMPLIFIER

CROSS-REFERENCE TO RELATED APPLICATIONS

This application claims priority to pending U.S. Provisional Application No. 60/368,372, filed Mar. 28, 2002, and entitled "Low Power Current Feedback Amplifier."

FIELD OF INVENTION

The present invention relates to amplifier circuits. More particularly, the present invention relates to a low power current feedback amplifier with a lower output impedance input stage buffer.

BACKGROUND OF THE INVENTION

The increasing demand for higher performance amplifier circuits has resulted in the continued improvement of the precision and accuracy of the various devices and components within the amplifier circuits, as well the increased response and bandwidth, and lower power requirements, of the amplifier circuits. For example, current feedback amplifiers, such as those incorporated within various video and audio drivers, equalizing filters, ADC input drivers, and other communication devices, are being required to provide lower power with increased bandwidth.

It would be ideal if current feedback amplifiers had gain independent bandwidth; however, such is not the case in practical applications. One area that affects the bandwidth performance is the output impedance of the inverting input terminal of the current feedback amplifier. The inverting input terminal impedance of the current feedback amplifier typically ranges from moderate to high. This level of impedance increases as the quiescent current bias level within an input buffer of the current feedback amplifier is reduced.

For example, with reference to FIG. 1, a basic current feedback amplifier 100 having an input buffer 102, a pair of current mirrors 104 and 106, and an output stage 108 illustrated. Input buffer 102 provides input terminals INP and INN for current feedback amplifier 100. A pair of output terminals of input buffer 102 drive current mirrors 104 and 106, which can provide a mirrored current to output stage 108.

Input buffer 102 comprises an open loop buffer, such as that illustrated in FIG. 2, including bias currents $I_1$ and $I_2$, a pair of input diode-connected transistors $Q_1$, and $Q_2$, and a pair of output devices $Q_3$ and $Q_4$. As discussed above, ideally, the bandwidth of current feedback amplifier 100 is independent of the gain of current feedback amplifier 100; however, in reality, the bandwidth of current feedback amplifier 100 is dependent upon any compensation capacitance and the value of an external feedback resistor $R_{FBext}$ (not shown) that can be configured in a closed feedback loop with current feedback amplifier 100. The output impedance of input buffer 102 gets multiplied by the noise gain of current feedback amplifier 100 and adds to the external discrete feedback resistor, to give an equivalent feedback resistor. For example:

$$R_{FBext} + (\text{Noise Gain} * \text{Input Buffer Output Impedance}) = R_{FBequiv}$$

Equivalent feedback resistor $R_{FBequiv}$ determines the bandwidth of current feedback amplifier 100. Changing the noise gain of current feedback amplifier 100 in an effort to try and maintain bandwidth requires changes in the value of equivalent feedback resistor $R_{FBequiv}$. As a result, the bandwidth is never constant due to other effects on the output impedance of input buffer 102. In addition, for low power applications, the higher output impedance becomes even more problematic, i.e., lower quiescent current results in higher output impedance.

One attempt to solve the higher output impedance problems of input buffer 102 includes the increasing of biasing currents $I_1$ and $I_2$ to reduce the output impedance of input buffer 102. However, increasing biasing currents $I_1$ and $I_2$ increases the quiescent power requirements, which is undesirable.

SUMMARY OF THE INVENTION

In accordance with various aspects of the present invention, an overall low power current feedback amplifier having a lower output impedance input stage is provided. To reduce the output impedance, the input stage comprises a closed-loop input buffer. The closed-loop input buffer realizes a low output impedance since the loop gain of the input buffer reduces the output impedance of the input buffer. With a lower output impedance, the bandwidth of the current feedback amplifier becomes more independent of the gain, even at low supply current implementations.

An exemplary input buffer can be configured in a current feedback amplifier or a voltage feedback amplifier arrangement. In accordance with an exemplary embodiment, the input buffer comprises another closed-loop current feedback amplifier configured within the overall current feedback amplifier, wherein the output of the input buffer corresponds to the inverting node of the overall current feedback amplifier. The closed-loop configuration of the input buffer is facilitated by the use of an internal feedback resistor coupled from an inverting input terminal of the input buffer to the output of the input buffer, which corresponds to the inverting input terminal of the overall current feedback amplifier. Thus, with a low impedance at the inverting input terminal, the overall current feedback amplifier realizes a gain independent bandwidth over a wide range of supply currents.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

The present invention may be described herein in terms of various functional components. It should be appreciated that such functional components may be realized by any number of hardware or structural components configured to perform the specified functions. For example, the present invention may employ various integrated components, such as buffers, current mirrors, and logic devices comprised of various electrical devices, e.g., resistors, transistors, capacitors, diodes and the like, whose values may be suitably configured for various intended purposes. In addition, the present invention may be practiced in any integrated circuit application. For purposes of illustration only, exemplary embodiments of the present invention may be described herein in connection with a current feedback amplifier such as may be configured within an integrated circuit. Further, it should be noted that while various components may be suitably coupled or connected to other components within exemplary circuits, such connections and couplings can be realized by direct connection between components, or by connection through other components and devices located thereinbetween.

As discussed above, prior art current feedback amplifiers have input buffers with relatively high output impedance, which results in bandwidth being very dependent upon the gain setting of the current feedback amplifier. However, in accordance with various aspects of the present invention, a low power current feedback amplifier having a lower output impedance input stage is provided. To reduce the output impedance, the input stage comprises a closed-loop-input buffer. The closed-loop-input buffer realizes a low output impedance since the loop gain of the input buffer reduces the output impedance of the input buffer. With a lower output impedance, the bandwidth of the current feedback amplifier becomes more independent of the gain, even at low current implementations.

Figure 1:
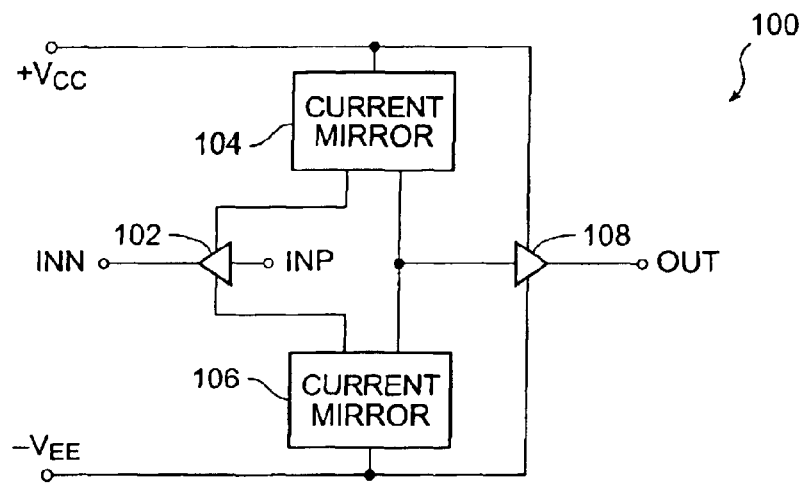
FIG. 1 illustrates a block diagram of a prior art current feedback amplifier including an input buffer.
Figure 2:
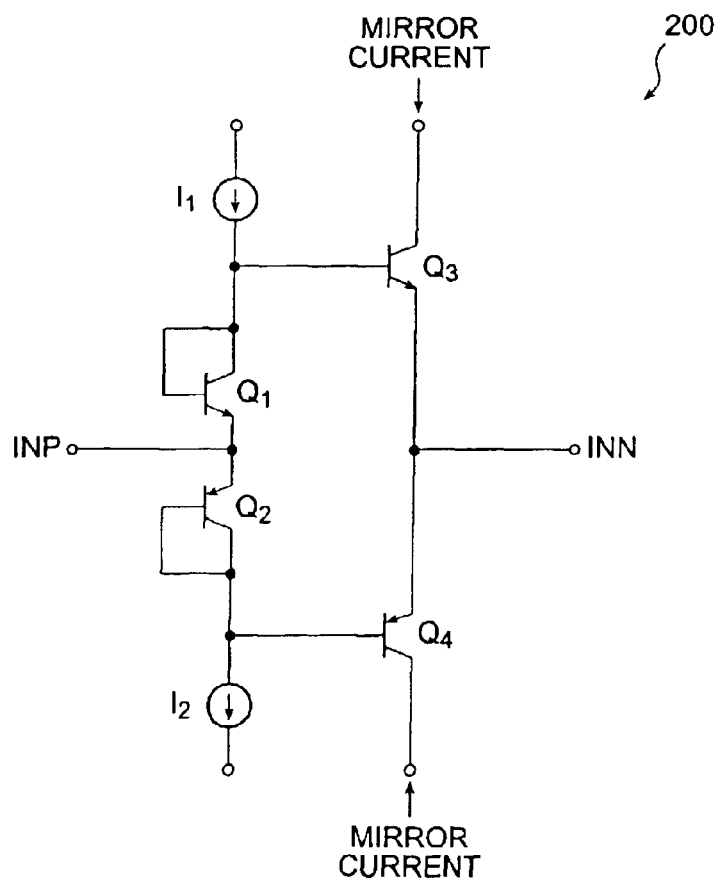
FIG. 2 illustrates a schematic diagram of a prior art open-loop input buffer for use in a current feedback amplifier.
Figure 3:
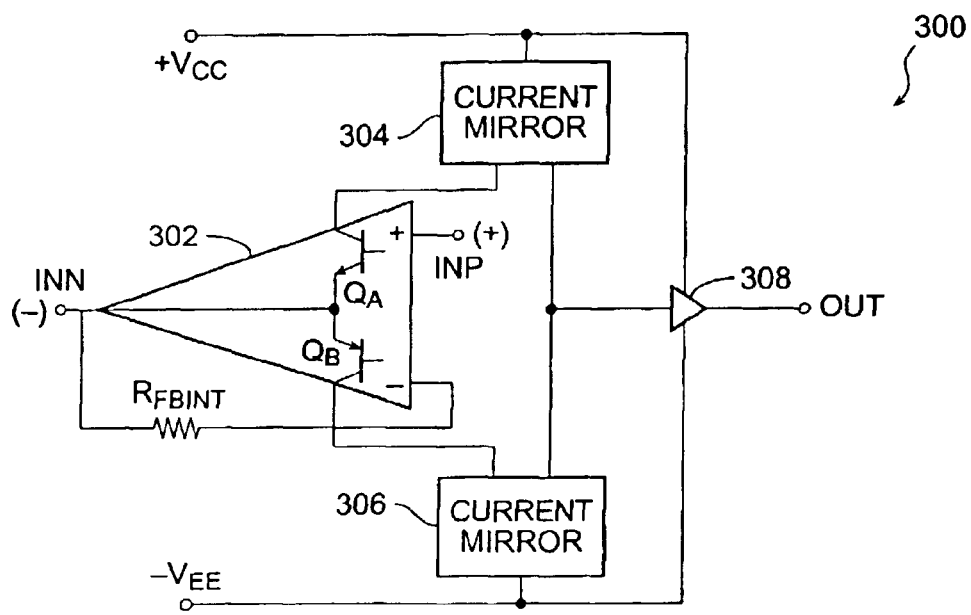
FIG. 3 illustrates a block diagram of a current feedback amplifier with a closed-loop input buffer in accordance with an exemplary embodiment of the present invention.

For example, with reference to FIG. 3, in accordance with an exemplary embodiment, an overall current feedback amplifier 300 comprises an input buffer 302, a pair of upper and lower current mirrors 304 and 306, and an output stage 308. Current feedback amplifier 300 can be configured within various integrated circuit applications and/or various electronic systems and devices.

In accordance with the exemplary embodiment, input buffer 302 is configured to provide input terminals INP (+) and INN (−) for current feedback amplifier 300, with non-inverting input terminal INP (+) configured at the non-inverting input terminal of input buffer 302 and with negative input terminal INN (−) configured at the output terminal of input stage 302. Input buffer 302 comprises a pair of output devices $Q_A$ and $Q_B$ configured to drive current mirrors 304 and 306, which can provide a mirrored current to output stage 308. Overall upper and lower current mirrors 304 and 306 can comprise any configuration, circuit and/or device for mirroring current from input buffer 302, e.g., from output devices $Q_A$ and $Q_B$, to output stage 308. Output stage 308 can also comprise any output buffer configuration for providing an output signal OUT for current feedback amplifier 300.

In accordance with an exemplary embodiment, input buffer 302 comprises a closed-loop feedback amplifier configured within overall current feedback amplifier 300. The closed-loop configuration is facilitated by the use of an internal feedback component, for example internal feedback resistor $R_{FBINT}$, coupled from an inverting input terminal of input buffer 302 to the output terminal of input buffer 302, i.e., to inverting terminal INN (−) of overall current feedback amplifier 300. The closed-loop configuration of input buffer 302 facilitates a low output impedance for input buffer 302, thus providing a low impedance at inverting terminal INN (−) of current feedback amplifier 300. As a result, overall current feedback amplifier 300 can realize a gain independent bandwidth for high and low supply current applications.

Closed-loop input buffer 302 can be configured in various gain configurations. For example, in accordance with the exemplary embodiment, closed-loop input buffer 302 is configured with a non-inverting gain of one (1). However, closed-loop buffer 302 could also be configured with a gain resistor $R_G$ coupled between the inverting input terminal and ground, with gain resistor $R_G$ having various resistance values to provide a gain of other than unity.

Figure 4:
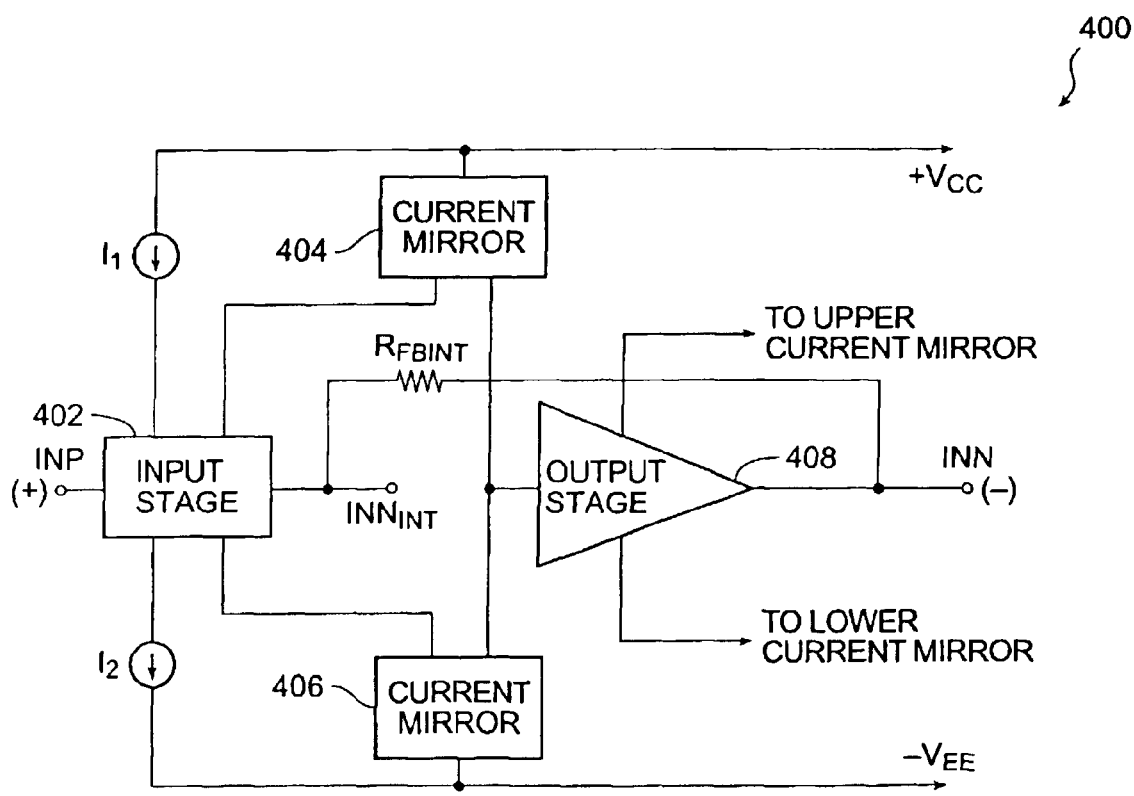
FIG. 4 illustrates a block diagram of exemplary input buffer comprising a closed-loop current feedback amplifier in accordance with an exemplary embodiment of the present invention.

Closed-loop input buffer 302 can also be configured in various arrangements, such as current feedback amplifier and voltage feedback amplifier configurations. For example, in accordance with an exemplary embodiment, with reference to FIG. 4, an exemplary closed-loop input buffer 400 can be configured as a closed-loop current feedback amplifier, i.e., an overall current feedback amplifier can be configured with an input buffer comprising another closed-loop current feedback amplifier configured to provide a low impedance at inverting terminal INN (−) of the overall current feedback amplifier.

In accordance with the exemplary embodiment, input buffer 400 configured as a closed-loop current feedback amplifier can comprise bias currents $I_1$ and $I_2$, an input stage 402, a pair of current mirrors 404 and 406, and an output stage 408. Input buffer 400 is configured to provide input terminals INP (+) and INN (−) for an overall current feedback amplifier, such as current feedback amplifier 300.

Input stage 402 can comprise various amplifier configurations for providing current signals to current mirrors 404 and 406. Input stage 402 includes a non-inverting input terminal configured as positive input terminal INP (+) for an overall current feedback amplifier, and an internal inverting input terminal $INN_{INT}$. Input stage 402 also includes current output terminals configured to drive upper and lower current mirrors 404 and 406. In addition, input stage 402 can also be configured with bias currents $I_1$ and $I_2$ configured to set the operating point of input stage 402. Such bias currents can comprise any current source circuit or device for providing a bias current to input stage 402.

Current mirrors 404 and 406 can comprise any configuration, circuit and/or device for mirroring current from input stage 402 to output stage 408. Thus, current mirrors 404 and 406 can comprise various bandwidth compensation schemes and or anti-saturating components depending on any given design criteria. Current mirrors 404 and 406 have outputs configured to provide a voltage signals to a high impedance node.

Output stage 408 can also comprise any output buffer configuration for providing an output for input buffer 400, including any type of internal amplifier structure. Output buffer 408 has an input terminal configured to receive voltage signals from the high impedance node formed from at output of current mirrors 404 and 406, and an output terminal configured to provide a inverting terminal INN (−) for an overall current feedback amplifier, such as current feedback amplifier 300.

The closed-loop configuration of input buffer 400 is facilitated through an internal feedback resistor $R_{FBINT}$ coupled from inverting input terminal $INN_{INT}$ of input stage 402 to the output terminal of output stage 408, i.e., to inverting terminal INN (−) of an overall current feedback amplifier. Internal feedback resistor $R_{FBINT}$ can comprise various configurations, such as a single resistor, a resistor divider, or other resistor network. The closed-loop configuration of input buffer 400 facilitates a low output impedance for input buffer 400, and thus provides a low impedance at inverting terminal INN (−) for an overall current feedback amplifier.

During operation, a voltage applied to non-inverting input INP (+) of input stage 402 will appear at its output, $INN_{Int-}$. As a result, a voltage difference across internal feedback resistor $R_{FBINT}$, comprising the voltage difference between output $INN_{int-}$ and inverting input terminal INN (−), will appear. The voltage difference causes a current to flow in internal feedback resistor $R_{FBINT}$ that input stage 402 can suitably sink or source as needed. The current that input stage 402 sinks or sources appears at current mirrors 404 and 406, which provide a resulting voltage signal to the high impedance node. Accordingly, the resulting voltage that appears at the input terminal of output stage 408 drives inverting input terminal INN (−) to suitably match the voltage signal appearing at non-inverting input terminal INP (+).

Figure 5:
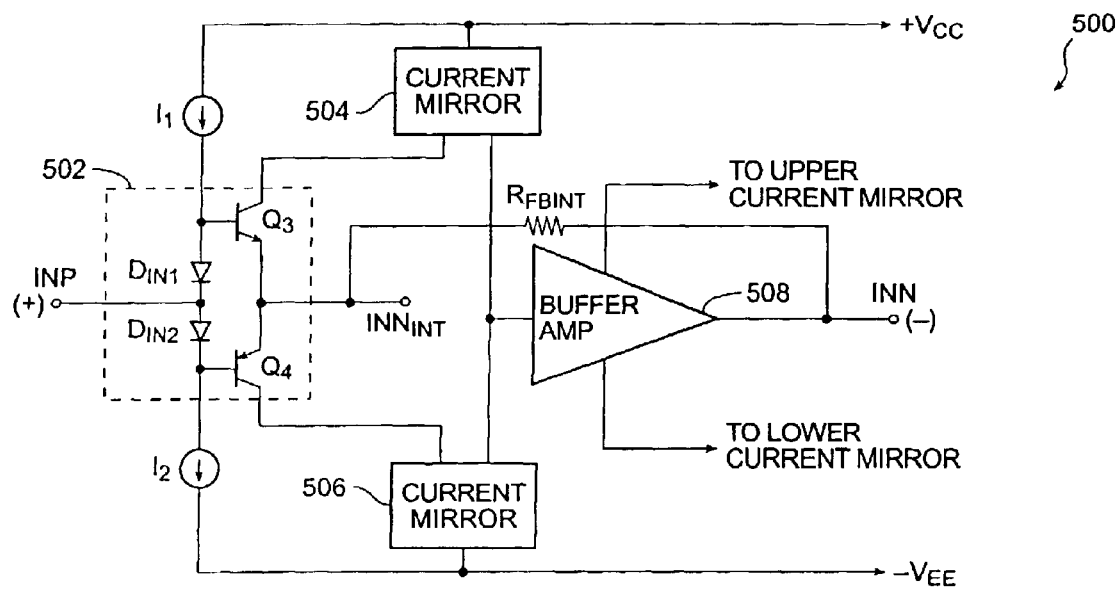
FIG. 5 illustrates a schematic diagram of an exemplary input buffer comprising a closed-loop current feedback amplifier in accordance with an exemplary embodiment of the present invention.

As discussed above, bias currents $I_1$ and $I_2$, input stage 402, current mirrors 404 and 406, and output stage 408 can be configured in various manners for providing a low output impedance for input buffer 400, and thus for providing a low impedance at inverting terminal INN (−) for an overall current feedback amplifier. In accordance with an exemplary embodiment, with reference to FIG. 5, an exemplary input buffer 500 configured as a closed-loop current feedback amplifier can comprise bias currents $I_1$ and $I_2$, an input stage 502, a pair of current mirrors 504 and 506, and an output stage 508.

Input stage 502 is configured for providing an input signal received at input terminals to current mirrors 504 and 506. In accordance with the exemplary embodiment, input stage 502 comprises a pair of input diode devices $D_{IN1}$ and $D_{IN2}$, and a pair of output devices $Q_3$ and $Q_4$, with the base of device $Q_3$ coupled to diode devices $D_{IN1}$ and biasing current $I_1$, and the base of device $Q_4$ coupled to diode devices $D_{IN2}$ and biasing current $I_2$. Diode devices $D_{IN1}$ and $D_{IN2}$ are coupled together to provide a non-inverting input terminal INP (+) for input buffer 500, which can also comprise the non-inverting input terminal of an overall current feedback amplifier. The emitters of output devices $Q_3$ and $Q_4$ are coupled together to provide a inverting input terminal $INN_{INT}$ (−) for input buffer 500. The collectors of output devices $Q_3$ and $Q_4$ are configured to drive current mirrors 504 and 506, respectively.

Diode devices $D_{IN1}$ and $D_{IN2}$ can comprise any diode-device, such as a single diode or a series of diodes, or a diode-connected transistor. For example, with momentary reference to FIG. 6, in accordance with an exemplary embodiment, an input stage 602 can comprise a diode input buffer having a diamond buffer configuration, with input stage 602 providing a lower offset than other embodiments disclosed. Input stage 602 comprises a pair of input diode-connected transistors $Q_1$ and $Q_2$, with the base of device $Q_1$ coupled to the base of $Q_3$, and the base of device $Q_2$ coupled to the base of $Q_4$, and with the collectors of transistors $Q_1$ and $Q_2$ coupled to biasing currents $I_1$ and $I_2$, respectively. Further, the emitters of diode-connected transistors $Q_1$ and $Q_2$ are coupled together to provide a non-inverting input terminal INP (+) for input buffer 500, which can also comprise the non-inverting input terminal of an overall current feedback amplifier. Other exemplary embodiments of diode devices $D_{IN1}$ and $D_{IN2}$ can comprise other types of diode-connected transistor configurations, or other diode arrangements.

Figure 6:
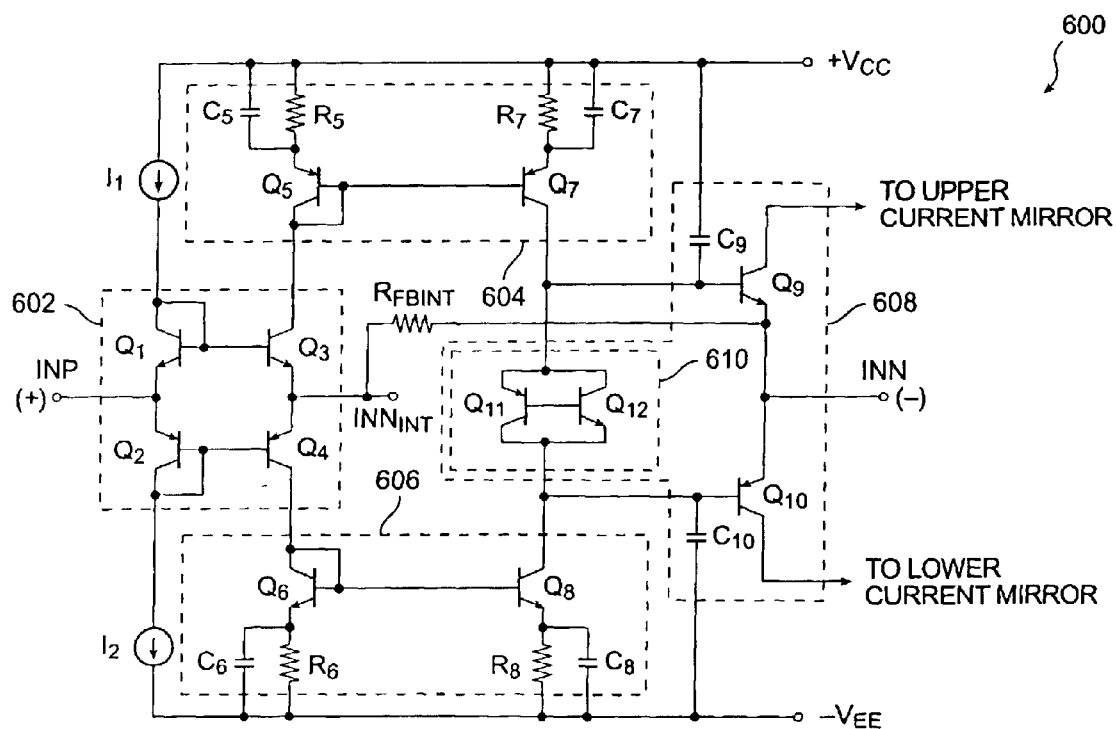
FIG. 6 illustrates a schematic diagram of an exemplary input buffer comprising a closed-loop current feedback amplifier in accordance with another exemplary embodiment of the present invention.
Figure 7:
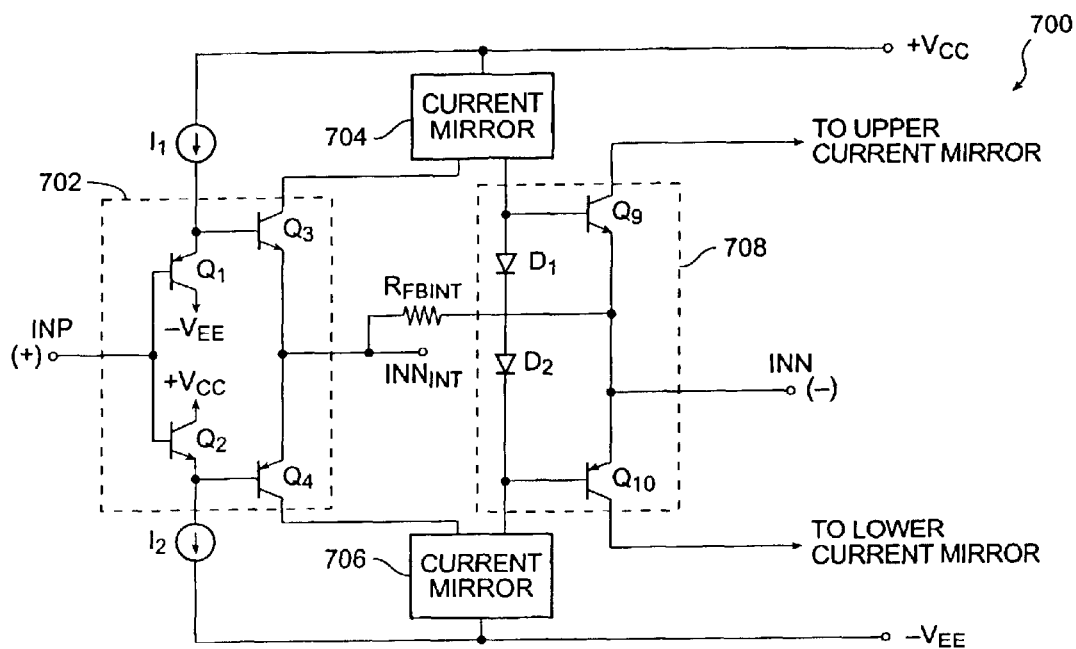
FIG. 7 illustrates a schematic diagram of an exemplary input buffer comprising a closed-loop current feedback amplifier in accordance with another exemplary embodiment of the present invention.

While input stage 502 includes an exemplary configuration of diode devices $D_{IN1}$ and $D_{IN2}$, such as transistors $Q_1$ and $Q_2$ of the exemplary embodiment of FIG. 6, and can include transistors $Q_3$ and $Q_4$, other input stage configurations can be implemented. For example, with momentary reference to FIG. 7, an input stage 702 of an input buffer 700 can be configured as a transistor base input buffer within a diamond buffer configuration, and can realize a higher input impedance and lower input bias current requirements. Input stage 702 can be configured with transistors $Q_1$ and $Q_2$ having emitters coupled to the bases of transistors $Q_3$ and $Q_4$, respectively, and having collectors coupled to lower supply rail–$V_{EE}$ and upper supply rail+$V_{CC}$, respectively.

Figure 8:
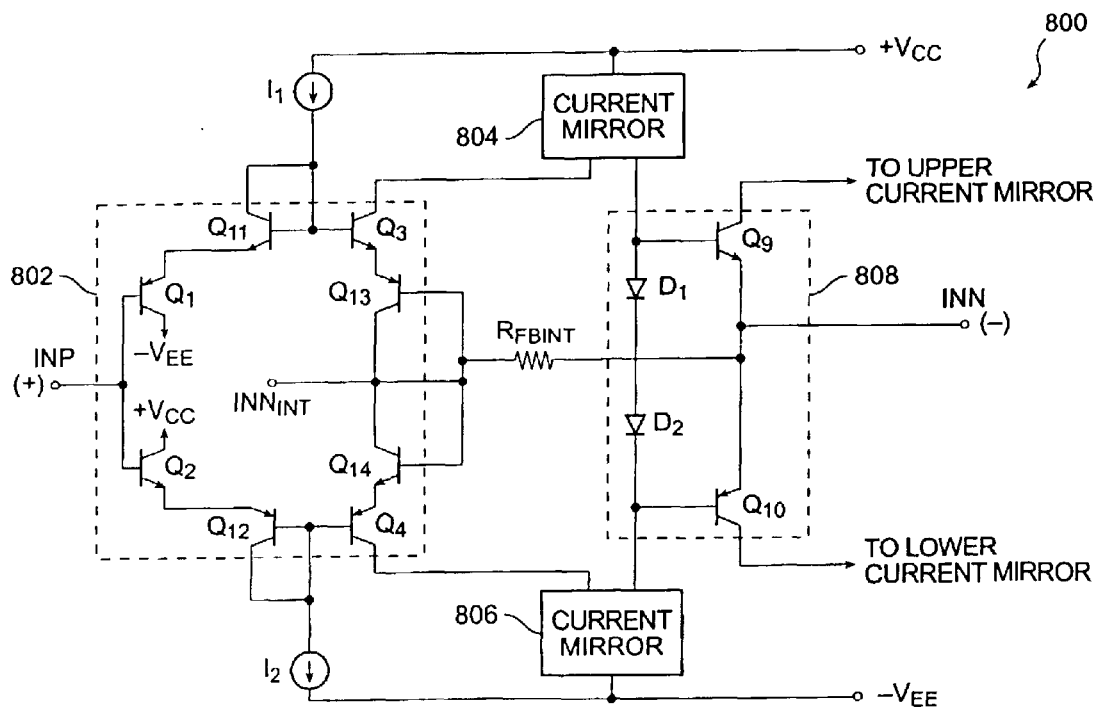
FIG. 8 illustrates a schematic diagram of exemplary input buffer comprising a closed-loop current feedback amplifier in accordance with another exemplary embodiment of the present invention.

In addition, with momentary reference to FIG. 8, in accordance with another exemplary embodiment, an input stage 802 of an input buffer 800 can be configured with transistors $Q_1$ and $Q_2$ having emitters coupled to the bases of transistors $Q_3$ and $Q_4$, respectively, through transistors $Q_{11}$ and $Q_{12}$, respectively. In accordance with this embodiment, the emitters of transistors $Q_1$ and $Q_2$ are coupled to the emitters of transistors $Q_{11}$ and $Q_{12}$, respectively. The collectors of transistors $Q_{11}$ and $Q_{12}$ are coupled to biasing currents $I_1$ and $I_2$, respectively, while the bases are coupled to the bases of transistors $Q_3$ and $Q_4$, respectively. In addition, the emitters of output devices $Q_3$ and $Q_4$ are coupled together through diode-connected transistors $Q_{13}$ and $Q_{14}$ to provide a inverting input terminal $INN_{INT}$ (−) for input buffer 500. In the exemplary embodiment, the bases of diode-connected transistors $Q_{13}$ and $Q_{14}$ are coupled to inverting input terminal $INN_{INT}$, i.e., coupled to internal feedback resistor $R_{FBINT}$. Accordingly, an exemplary input stage 502 can be configured in various manners and arrangements for providing an input signal received at input terminals INP (+) and $INN_{INT}$ to current mirrors 504 and 506.

Current mirrors 504 and 506 can be configured in various manners. For example, with reference again to FIG. 6, in accordance with an exemplary embodiment, a current mirror 604 comprises a diode-connected transistor $Q_5$ having an emitter coupled to an upper rail supply $V_{CC}$ through a degeneration resistor $R_5$, and a collector/base coupled to output device $Q_3$, and a transistor $Q_7$ having an emitter coupled to upper rail supply $V_{CC}$ through a degeneration resistor $R_7$, a base coupled to the base of diode-connected transistor $Q_5$, and a collector coupled to an output stage 608. In addition, current mirror 604 can comprise a pair of compensation capacitors $C_5$ and $C_7$ coupled in parallel with degeneration resistors $R_5$ and $R_7$, respectively, and configured to compensate the mirrored signal of current mirror 604. Meanwhile, a current mirror 606 comprises a diode-connected transistor $Q_6$ having an emitter coupled to a lower rail supply $V_{EE}$ through a degeneration resistor $R_6$, and a collector/base coupled to output device $Q_4$, and a transistor $Q_8$ having an emitter coupled to lower rail supply $V_{EE}$ through a degeneration resistor $R_8$, a base coupled to the base of diode-connected transistor $Q_6$, and a collector coupled to output stage 608. In addition, current mirror 606 can comprise a pair of compensation capacitors $C_6$ and $C_8$ coupled in parallel with degeneration resistors $R_6$ and $R_8$, respectively, and configured to compensate the mirrored signal of current mirror 606.

Output stage 508 has an input terminal configured to receive voltage signals from the high impedance node provided by current mirrors 504 and 506, and an output terminal configured to provide a inverting terminal INN (−) for an overall current feedback amplifier, such as current feedback amplifier 300. Output stage 508 can comprise various configurations for providing an output for input buffer 500, including any type of internal amplifier structure.

For example, with reference again to FIG. 6, an output stage 608 comprises a pair of output devices $Q_9$ and $Q_{10}$, with output device $Q_9$ having a collector coupled to an upper current mirror of the overall current feedback amplifier, e.g., to a current mirror 304 of an overall current feedback amplifier 300, and with output device $Q_{10}$ having a collector coupled to a lower current mirror of the overall current feedback amplifier, e.g., to a current mirror 306 of an overall current feedback amplifier 300. The emitters of output devices $Q_9$ and $Q_{10}$ are coupled together to provide an output terminal for input buffer 600, i.e., to provide inverting input terminal INN (−) of the overall current feedback amplifier. The bases of output devices $Q_9$ and $Q_{10}$ are driven by the collectors of transistors $Q_7$ and $Q_8$, respectively, to receive mirror currents from current mirrors 604 and 606, respectively. In addition, a compensation capacitor $C_9$ can be coupled between the base of output device $Q_9$ and upper supply $V_{CC}$, while a compensation capacitor $C_{10}$ can be coupled between the base of output device $C_{10}$ and lower supply $V_{EE}$, with compensation capacitors $C_9$ and $C_{10}$ being configured for overall compensation of input buffer 600. While compensation capacitors $C_9$ and $C_{10}$ are illustrated as being coupled to upper supply $V_{CC}$ and lower supply $V_{EE}$, respectively, compensation capacitors $C_9$ and $C_{10}$ can also be suitably coupled to either of upper supply $V_{CC}$ or lower supply $V_{EE}$, or to signal ground.

Output stage 608 can also comprise a diode circuit 610 coupled between the collectors of transistors $Q_7$ and $Q_8$ to control current flow through output devices $Q_9$ and $Q_{10}$. Diode circuit 610 can comprise a pair of diode devices, e.g., diode-connected transistors, connected in series between output devices $Q_9$ and $Q_{10}$, in which the amount of current flowing through the pair of series diodes is substantially the same as the current flowing through output devices $Q_9$ and $Q_{10}$. For example, with momentary reference again to FIGS. 7 and 8, a diode circuit 610 can comprise series diodes $D_1$ and $D_2$. However, in accordance with the exemplary embodiment illustrated in FIG. 6, diode circuit 610 comprises a pair of transistors $Q_{11}$ and $Q_{12}$ having bases coupled together, and the emitter of transistor $Q_{11}$ and the collector of transistor $Q_{12}$ coupled to the collector of transistor $Q_7$, and the emitter of transistor $Q_{12}$ and the collector of transistor $Q_{11}$ coupled to the collector of transistor $Q_8$. Through operation of such a diode circuit, the amount of current flowing through output devices $Q_9$ and $Q_{10}$ is divided substantially into half of the amount of current flowing through transistor $Q_{11}$ and transistor $Q_{12}$.

Figure 9:
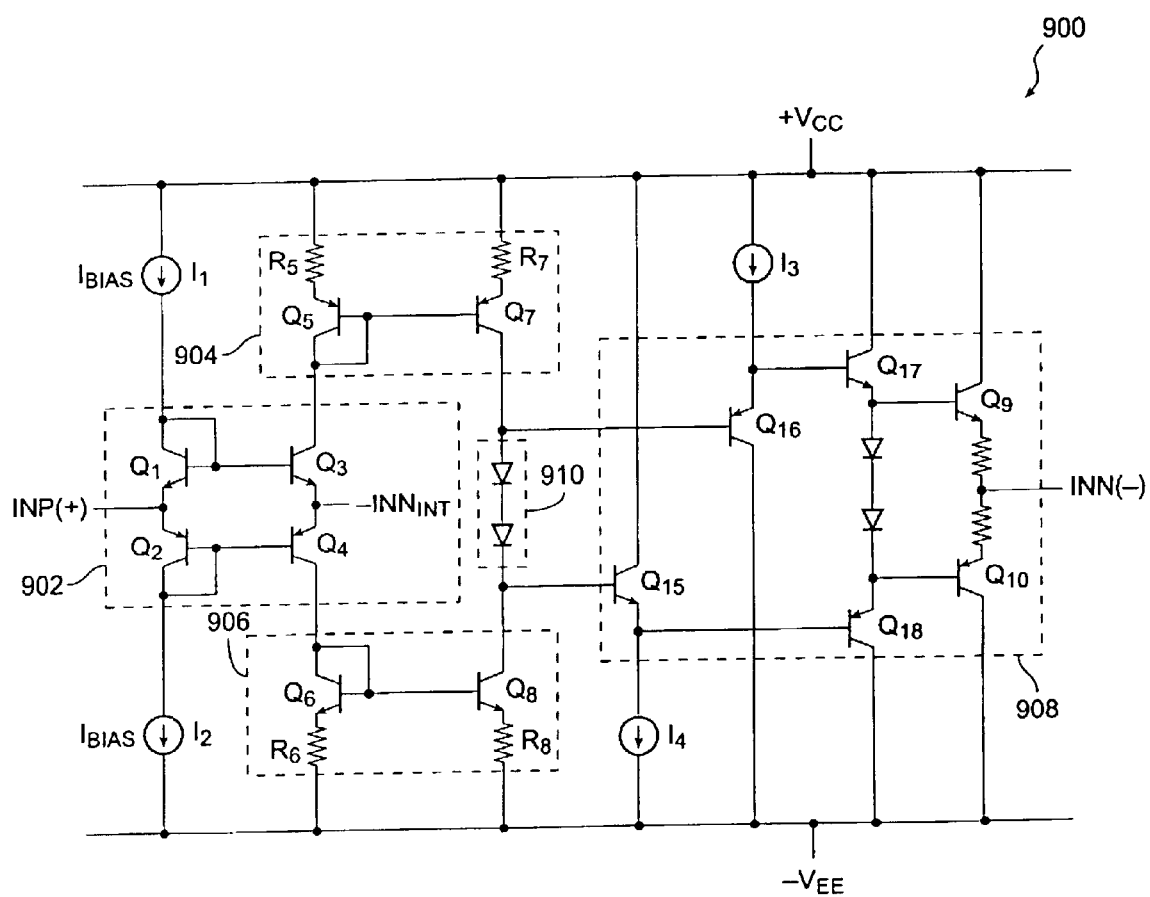
FIG. 9 illustrates a schematic diagram of an exemplary input buffer comprising a closed-loop current feedback amplifier in accordance with another exemplary embodiment of the present invention.

In accordance with another exemplary embodiment, with reference to FIG. 9, an exemplary output stage 908 can comprise additional transistors $Q_{15}$, $Q_{16}$, $Q_{17}$ and $Q_{18}$. Transistors $Q_{17}$ and $Q_{18}$ comprise emitter followers configured to drive the bases of output devices $Q_9$ and $Q_{10}$, instead of being driven directly by current mirrors 604 and 606 as in FIG. 6. Transistors $Q_{15}$ and $Q_{16}$ also comprise emitter followers configured to drive transistors $Q_{17}$ and $Q_{18}$, respectively. A configuration including emitter followers feeding emitter followers from signal mirrors 904 and 906 can provide more signal drive capability at the output of output stage 908. Such a configuration can also isolate the output of current mirrors 904 and 906, e.g., by beta squared, from the load variation at the output of output stage 908.

With reference again to FIG. 5, to facilitate the closed-loop configuration, an internal feedback resistor $R_{FBINT}$ is coupled from inverting input terminal $INN_{INT}$ of input buffer 502 to the output of input buffer 508, i.e., to inverting terminal INN (−) of the overall current feedback amplifier. Internal feedback resistor $R_{FBINT}$ can comprise various configurations, such as a single resistor, a resistor divider, or other resistor network. Internal feedback resistor $R_{FBINT}$ can also comprise various resistance values, for example varying between approximately 10 to 500 ohms or more, depending on the compensation and slew rate desired for input buffer 500.

As a result of the closed-loop configuration of an exemplary input buffer, a low output impedance is realized, thus providing a low impedance at inverting terminal INN (−) of the overall current feedback amplifier. As a result, an overall current feedback amplifier can realize a gain independent bandwidth for high and low current applications.

In addition, a higher performance bandwidth and transimpedance capability can be realized by an overall current feedback amplifier implementing an exemplary closed-loop input buffer. In this instance, transimpedance is defined as the input signal current divided into the resulting output voltage. For example, with reference again to FIG. 3, current signals flowing in input buffer 302 also flow in signal current mirrors 304 and 306 of current feedback amplifier 300 along with the signal currents of main amplifier 300. This results in a higher transimpedance and bandwidth for the overall amplifier. Since the main amplifier input signal current results in additional signal current (comprising the combination of the main amplifier input signal current and the signal current from closed-loop input buffer 302) running through the main amplifier signal mirrors, thus resulting in a higher equivalent transimpedance.

Moreover, with nominal biasing, the output impedance of an exemplary closed-loop input buffer 302 can be approximately 10 times or more lower than the output impedance of an open-loop input buffer of the prior art. In this instance, nominal biasing refers to the typical biasing that would be used in the input stage for a low power current feedback amplifier.

It should also be noted that the internal output buffer of closed-loop input amplifier 302, e.g., output buffers 408, 508, 608, 708, 808 and 908, can provide additional features. For example, with reference to FIGS. 3 and 4, internal output buffer 408 can comprise a voltage follower configuration that provides drive to inverting input $INN_{INT}$ of input buffer 402, through internal feedback resistor $R_{FBINT}$, and provides drive for inverting input terminal INN(−) of overall current feedback amplifier 300. In other words, output buffer 408 can be configured for driving inverting input $INN_{INT}$ and input terminal INN(−) such that the sum of the signal currents for inverting input $INN_{INT}$ and input terminal INN(−) is flowing in overall upper and lower current mirrors 304 and 306. As a result, output buffer 408 can provide a cascoded error path for input buffer 402, and can provide a cascoded error path for overall current feedback amplifier 300.

While the various exemplary input buffer discussed above comprise closed-loop current feedback amplifier, in accordance with other exemplary embodiments, an exemplary input buffer can comprise a closed-loop voltage feedback amplifier.

Figure 10A:
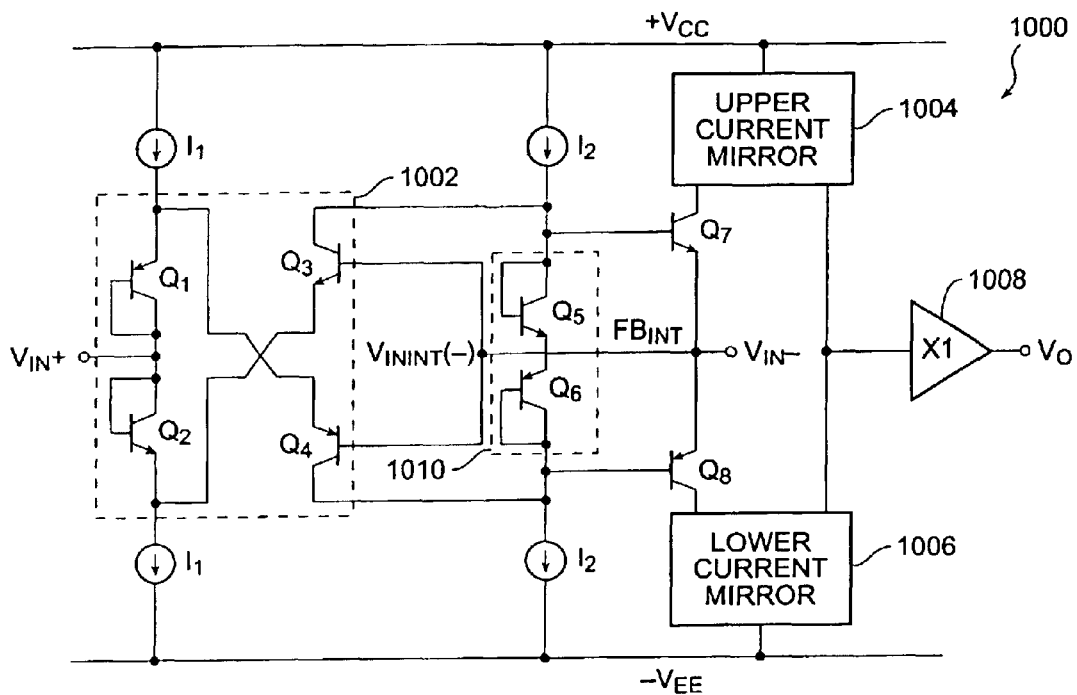
FIGS. 10A and 10B illustrate schematic diagrams of an exemplary input buffer comprising a closed-loop voltage feedback amplifier in accordance with another exemplary embodiment of the present invention.
Figure 10B:
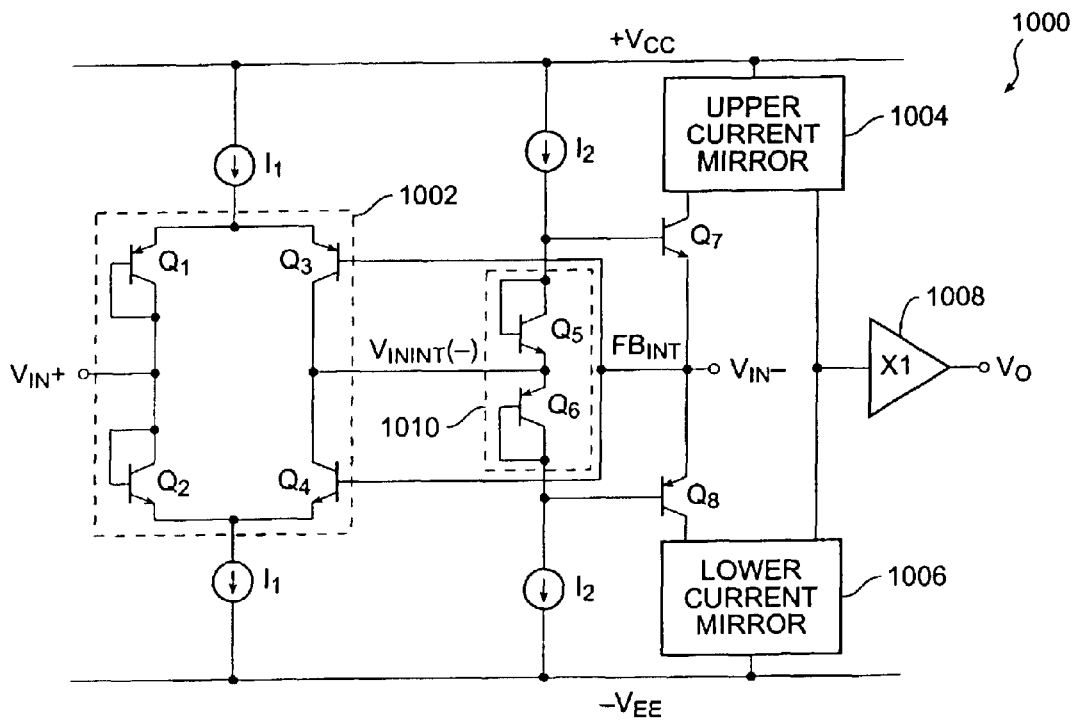

For example with reference to FIGS. 10A and 10B, a dual, diode input, differential pair voltage feedback amplifier 1000 configured as a unity gain buffer comprises an input stage 1002, upper and lower current mirrors 1004 and 1006, and an output stage 1008. A dual configuration can be used in order to provide upper and lower signal currents from the collectors of transistors $Q_7$ and $Q_8$, to feed current mirrors 1004 and 1006. Input stage 1002 comprises PNP differential transistor pairs $Q_1$ and $Q_4$ and NPN differential transistor pairs $Q_2$ and $Q_3$. Current sources $I_1$ and $I_2$ provide currents used to bias input stage 1002. An internal feedback component, $FB_{INT}$, comprising a direct connection wire or a zero (0) ohm resistor, is coupled between the base terminals of transistors Q3 and Q4 and negative terminal $V_{IN}-$. Internal feedback component $FB_{INT}$ can also be configured with a gain set resistor, for example, if it is desirable to have the input stage 1002 have a gain other than 1. A diode circuit 1010 comprising transistors $Q_5$ and $Q_6$ configured as diode-connected transistors to bias output transistors $Q_7$ and $Q_8$.

Figure 11:
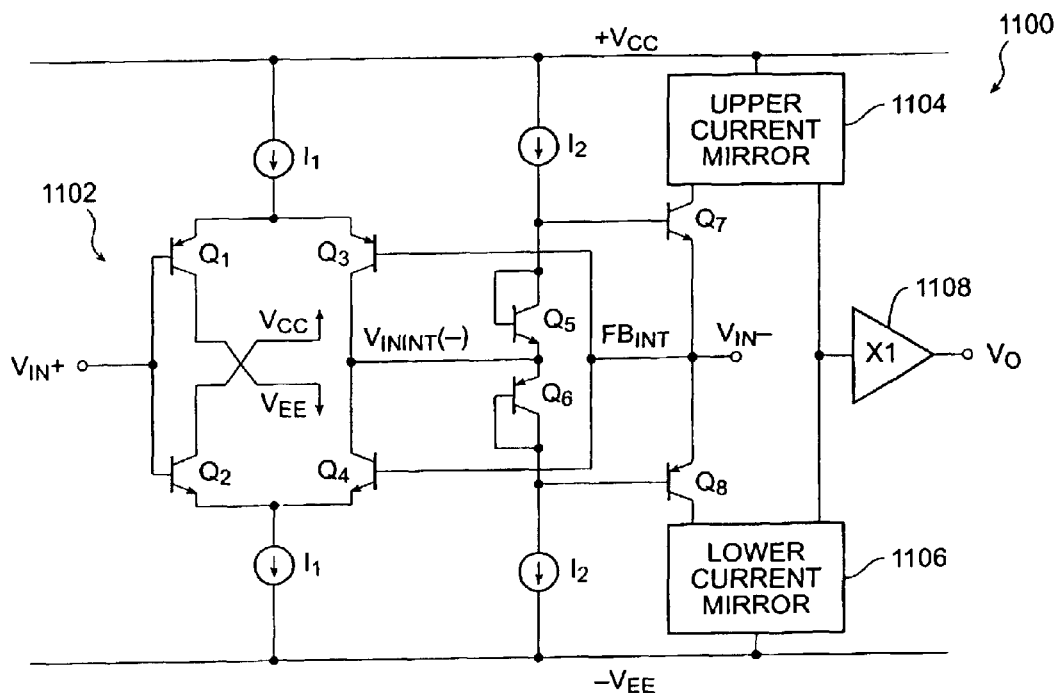
FIG. 11 illustrates a schematic diagram of an exemplary input buffer comprising a closed-loop voltage feedback amplifier in accordance with another exemplary embodiment of the present invention.

With reference to FIG. 11, an input buffer 1100 has a similar configuration as buffer 1000 of FIG. 10B; however, input buffer 1100 has "true" differential transistor input pairs $Q_1$, $Q_3$ and $Q_2$, $Q_4$. Thus, instead of diode-connected transistors $Q_1$ and $Q_2$ as comprised within input buffer 1000 illustrated in FIG. 10B, input transistors $Q_1$, $Q_3$ and $Q_2$, $Q_4$ are configured as standard differential pairs.

Figure 12:
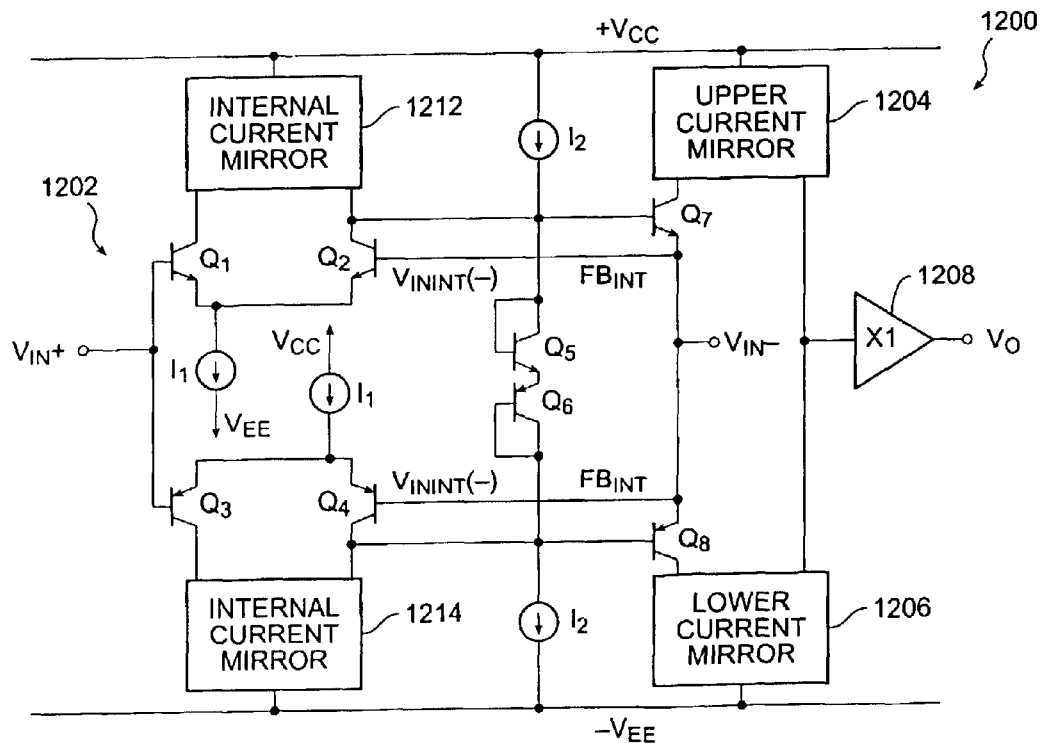
FIG. 12 illustrates a schematic diagram of an exemplary input buffer comprising a closed-loop voltage feedback amplifier in accordance with another exemplary embodiment of the present invention.

Still further, with reference to FIG. 12, yet another exemplary embodiment of an input buffer comprising a closed-loop voltage feedback amplifier 1200 is illustrated. An input stage 1202 comprises a pair of internal current mirrors 1212 and 1214, in addition to transistor pairs $Q_1$, $Q_3$ and $Q_2$, $Q_4$. In this exemplary embodiment, transistors $Q_1$, $Q_2$, and $Q_7$ and internal current mirror 1212 comprise a first voltage feedback amplifier, and transistors $Q_3$, $Q_4$, and $Q_8$ and internal current mirror 1214 comprise a second voltage feedback amplifiers. Diode-connected transistors $Q_5$ and $Q_6$ are configured to bias output transistors $Q_7$ and $Q_8$, whose collectors feed upper and lower current mirrors 1204 and 1206 of the main current feedback amplifier.

Like output buffers 408, 508, 608, 708, 808 and 908, the output buffer comprising transistors $Q_7$ and $Q_8$ of FIGS. 10A, 10B, 11 and 12 can provide various features, such as a cascoded error path for the internal closed-loop input buffer, and a cascoded error path for overall current feedback amplifier 300.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by implementing FET devices for various of the bipolar transistor devices. Further, the various exemplary embodiments can be implemented with other types of circuits in addition to those illustrated above. These alternatives can be suitably selected depending upon the particular application or in consideration of any number of factors associated with the operation of the system. Moreover, these and other changes or modifications are intended to be included within the scope of the present invention.

What is claimed is:

1. A low power current feedback amplifier configured for providing gain independent bandwidth, said current feedback amplifier comprising:

a closed-loop input buffer having a first input terminal configured to provide a non-inverting input terminal for said current feedback amplifier, an output terminal configured to provide an inverting input terminal for said current feedback amplifier, and an internal feedback component coupled between said output terminal and a second input terminal of said closed-loop input buffer;

a first current mirror coupled to said input buffer and configured to mirror current from said input buffer;

a second current mirror coupled to said input buffer and configured to mirror current from said input buffer; and an output buffer configured to provide an output signal for said current feedback amplifier.

2. The current feedback amplifier according to claim 1, wherein said input buffer comprises a closed-loop current feedback amplifier, and said internal feedback component comprises an internal feedback resistor.

3. The current feedback amplifier according to claim 2, wherein said closed-loop current feedback amplifier comprises:

an input stage configured to provide said first input terminal and said second input terminal;

a third current mirror coupled to said input stage;

a fourth current mirror coupled to said input stage; and an output stage having an output terminal configured to provide said inverting input terminal for said current feedback amplifier, said output stage coupled to said third current mirror and said fourth current mirror and configured to receive mirrored current from said input stage, and said output stage coupled to said first current mirror and said second current mirror of said current feedback amplifier.

4. The current feedback amplifier according to claim 3, wherein said input buffer further comprises a first biasing current and a second biasing current coupled to said input stage.

5. The current feedback amplifier according to claim 4, wherein said input stage comprises:

a first input diode device coupled between said first biasing current and said first input terminal of said input buffer;

a second input diode device coupled between said second biasing current and said first input terminal of said input buffer;

a first output device coupled between said first input diode device and said third current mirror; and a second output device coupled between said second input diode device and said fourth current mirror.

6. The current feedback amplifier according to claim 5, wherein said first input diode device comprises a first diode-connected transistor, and said second input diode device comprises a second diode-connected transistor.

7. The current feedback amplifier according to claim 6, wherein said first output device comprises a first output transistor having a base coupled to a base of said first diode-connected transistor and a collector coupled to said third current mirror, and said second output device comprises a second output transistor having a base coupled to a base of said second diode-connected transistor and a collector coupled to said fourth current mirror.

8. The current feedback amplifier according to claim 7, wherein each of said first output transistor and said second output transistor have an emitter coupled to said second input terminal of said input buffer.

9. The current feedback amplifier according to claim 8, wherein said first output transistor and said second output transistor have emitters coupled to said second input terminal of said input buffer through a pair of transistors.

10. The current feedback amplifier according to claim 3, wherein said output stage is configured to drive signal currents for said inverting input terminal for said current feedback amplifier and for said second input terminal of said closed loop input buffer.

11. The current feedback amplifier according to claim 10, wherein said output stage is further configured such that a sum of said signal currents for said inverting input terminal for said current feedback amplifier is flowing in said first current mirror and said second current mirror.

12. The current feedback amplifier according to claim 3, wherein said output stage comprises:

a first output device coupled between said third current mirror and said inverting input terminal for said current feedback amplifier; and a second output device coupled between said fourth current mirror and said inverting input terminal for said current feedback amplifier.

13. The current feedback amplifier according to claim 12, wherein said output stage further comprises a diode circuit coupled between said third current mirror and said fourth current mirror.

14. A current feedback amplifier configured for low power applications, said current feedback amplifier comprising:

an input buffer comprising:

a non-inverting input terminal configured to provide a non-inverting input terminal for said current feedback amplifier;

an inverting input terminal;

an output terminal configured to provide an inverting input terminal for said current feedback amplifier;

an internal feedback component coupled between said output terminal of said input buffer and said second input terminal of said input buffer to provide a closed-loop configuration, wherein said closed-loop configuration is configured to provide a low output impedance at said inverting input terminal of said current feedback amplifier such that bandwidth of said current feedback amplifier is substantially independent of any gain of said current feedback amplifier;

a pair of current mirrors coupled to said input buffer and configured to mirror current from said input buffer; and an output buffer configured to provide an output signal for said current feedback amplifier.

15. The current feedback amplifier according to claim 14, wherein said input buffer comprises a closed-loop current feedback amplifier, and said internal feedback component comprises an internal feedback resistor.

16. The current feedback amplifier according to claim 15, wherein said input buffer comprises:

an input stage configured to provide said non-inverting input terminal and said inverting input terminal of said input buffer;

a second pair of current mirrors coupled to said input stage; and an output stage having an output terminal configured to provide said inverting input terminal for said current feedback amplifier, said output stage coupled to said second pair of current mirrors and configured to receive mirrored current from said input stage, and said output stage coupled to said first pair of current mirrors of said current feedback amplifier.

17. The current feedback amplifier according to claim 16, wherein said input stage comprises:

a first diode device coupled between a first biasing current and said non-inverting input terminal of said input buffer;

a second diode device coupled between a second biasing current and said non-inverting input terminal of said input buffer;

a first output device coupled between said first diode device and one of said second pair of current mirrors; and a second output device coupled between said second diode device and another of said second pair of current mirrors.

18. The current feedback amplifier according to claim 16, wherein said output stage is configured to drive signal currents for said inverting input terminal for said current feedback amplifier and for said second input terminal of said closed loop input buffer.

19. The current feedback amplifier according to claim 18, wherein said output stage is further configured such that a sum of said signal currents for said inverting input terminal for said current feedback amplifier is flowing in said first current mirror and said second current mirror.

20. The current feedback amplifier according to claim 14, wherein said input buffer comprises a closed-loop voltage feedback amplifier, and said internal feedback component comprises a direct wiring connection.

21. An integrated circuit configured with an amplifier circuit comprising a current feedback amplifier configured for low power operation, said current feedback amplifier comprising:

an inverting input terminal and a non-inverting input terminal;

an input buffer comprising a closed-loop feedback amplifier configured to provide a low impedance at said inverting input terminal to provide said current feedback amplifier with a bandwidth substantially independent of a gain configuration of said current feedback amplifier, said input buffer comprising:

a first input terminal configured to provide said non-inverting input terminal for said current feedback amplifier;

an output terminal configured to provide said inverting input terminal for said current feedback amplifier; and an internal feedback resistor coupled between said output terminal and a second input terminal of said input buffer;

a first current mirror and a second current mirror coupled to said input buffer and configured to mirror current from said input buffer; and an output buffer configured to provide an output signal for said current feedback amplifier.

22. The integrated circuit according to claim 21, wherein said closed-loop feedback amplifier comprises a current feedback amplifier.

23. The integrated circuit according to claim 22, wherein said closed-loop feedback amplifier comprises:

an input stage configured to provide said first input terminal and said second input terminal;

a pair of current mirrors coupled to said input stage and configured to mirror current from said input stage; and an output stage configured to receive mirrored current from said input stage, said output stage coupled to said first current mirror and said second current mirror, and said output stage having an output terminal configured to provide said inverting input terminal for said current feedback amplifier.

24. The integrated circuit according to claim 23, wherein said output stage is configured to drive signal currents for said inverting input terminal for said current feedback amplifier and for said second input terminal of said closed loop input buffer such that a sum of said signal currents for said inverting input terminal for said current feedback amplifier is flowing in said first current mirror and said second current mirror.

25. An electronic system including a current feedback amplifier configured within an amplifier circuit, said current feedback amplifier comprising:

a closed-loop input buffer having a first input terminal configured to provide a non-inverting input terminal for said current feedback amplifier, an output terminal configured to provide an inverting input terminal for said current feedback amplifier, and an internal feedback component coupled between said output terminal and a second input terminal of said closed-loop input buffer;

a pair of current mirrors coupled to said input buffer and configured to mirror current from said input buffer; and an output buffer configured to provide an output signal for said current feedback amplifier.

26. The electronic system according to claim 25, wherein said closed-loop input buffer comprises a current feedback amplifier, said current feedback amplifier comprises:

an input stage comprises said first input terminal and said second input terminal, said first input terminal configured to provide said non-inverting input terminal;

a second pair of current mirrors coupled to said input stage; and an output stage having an output terminal configured to provide said inverting input terminal for said current feedback amplifier, said output stage coupled to said second pair of current mirrors and configured to receive mirrored current from said input stage, and said output stage coupled to said pair of current mirrors of said current feedback amplifier.

* * * * *